United States Patent [19]

Yu

[11] 4,178,620

[45] Dec. 11, 1979

[54] THREE STATE BUS DRIVER WITH PROTECTION CIRCUITRY

[75] Inventor: Steve K. Yu, San Jose, Calif.

[73] Assignee: Signetics Corporation, Sunnyvale, Calif.

[21] Appl. No.: 841,001

[22] Filed: Oct. 11, 1977

[51] Int. Cl.² .............................................. H02H 7/20
[52] U.S. Cl. ...................................... 361/98; 361/86; 361/89; 307/200 B
[58] Field of Search .................. 361/93, 94, 98, 101, 361/18, 86, 88, 89; 307/200 B, 205, 241, 242, 243, 251, 279, 303, 304; 330/207 P

[56] References Cited

U.S. PATENT DOCUMENTS

| 3,749,936 | 7/1973 | Bell .................................. 361/93 |
| 3,938,008 | 2/1976 | Knepper et al. ................ 361/98 X |
| 4,037,114 | 7/1977 | Stewart et al. ................. 307/205 |

Primary Examiner—Patrick R. Salce
Attorney, Agent, or Firm—Jerry A. Dinardo; Edward J. Connors, Jr.; Thomas A. Briody

[57] ABSTRACT

A protective circuit arrangement for three state bus drivers, incorporating insulated gate field effect transistors, affords protection against short circuiting of the output bus. The protective circuit senses the short circuit condition at the output bus of two push-pull output transistors and feeds back a signal to the input circuit of the ON transistor which reduces the input drive to that transistor and limits the output current through that transistor to a safe value.

10 Claims, 3 Drawing Figures

4,178,620

THREE STATE BUS DRIVER WITH PROTECTION CIRCUITRY

BACKGROUND OF THE INVENTION

This invention relates to bus drivers operating with three state outputs and to logic systems in which a plurality of such bus drivers are selectively enabled to drive a common bus.

In such logic systems there always exists the possibility that more than one driver might be driving the same bus simultaneously and that they might be driving against each other. In that event, one of the output transistors in a low impedance state could be subjected to current overload sufficient to cause it to burn out.

In order to minimize the probability of simultaneous bus drive by more than one driver, it is common to employ very precise timing circuits. However, even when the drivers are under precise timing control, there still exists the possibility of accidental short circuits that may be caused by defective wiring or device failure.

SUMMARY OF THE INVENTION

A protective circuit arrangement for three state insulated gate field effect transistor drivers connected to a common bus is disclosed which avoids the necessity for strict and precise timing control and also provides protection in case of accidental short circuits caused by defective wiring or by failure of one or more devices.

A bus driver equipped with a protection circuit according to the invention includes an input circuit for receiving an input logic signal, an output circuit including a push-pull output transistor pair for driving an output bus, and means including at least one inverter stage coupled between the input and output circuits for translating the input logic signal from the input circuit to the output circuit and developing a three state output logic signal at the output bus.

The protection circuit functions to limit the current flow through one of the transistors that is normally conducting when the output bus experiences a short circuit from a normally HIGH logic level to a LOW logic level and for limiting the current flow through the other one of the transistors that is normally conducting when the output bus experiences a short circuit from a normally LOW logic level to a HIGH logic level. The protection circuit includes means coupled to the output bus for sensing a short circuit condition thereat. In addition, control means are provided coupled between the sensing means and the input circuit to each one of the two transistors for reducing the input drive to that one of the transistors which is conducting when a short circuit condition occurs across its output circuit, so as to limit the output current through the conducting transistor to a safe value.

DETAILED DESCRIPTION OF THE PREFERRED EMBODIMENT

Figure 1:
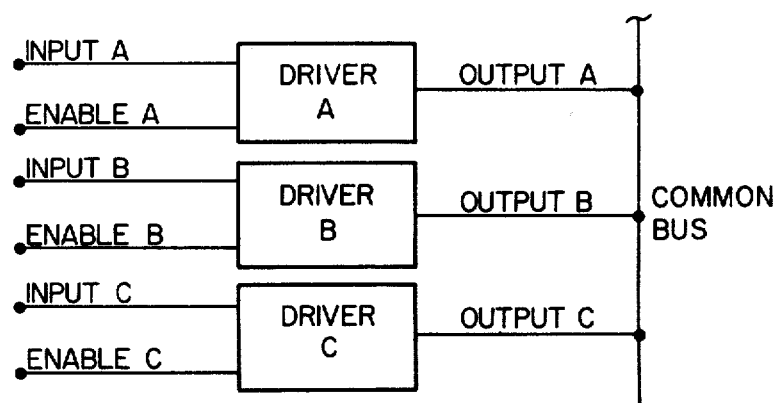
FIG. 1 is a block diagram of a logic system in which a plurality of drivers are coupled to a single common output bus.

Reference is now made to FIG. 1 which shows a plurality of drivers A, B, C with outputs connected to a common bus. Each of the bus drivers A, B, C has an input terminal for receiving a logical input signal and an enable terminal for receiving an enable signal which will enable the bus driver for a given interval of time. The enable signals A, B and C are sequenced in such a way that only one bus driver should be enabled for operation during a given interval of time, and the remaining bus drivers should be disabled during that interval. In the event of a malfunction of timing circuits which control the sequencing of the enable signals such that more than one driver is enabled concurrently, it is necessary to assure that the output circuitry of the drivers will not be subjected to excessively high current for any appreciable length of time.

Protection circuitry is provided according to the invention wherein a short circuit condition in the output transistor circuitry of a driver is sensed and a signal is fed back to the input of the conducting transistor which is affected by the short circuit condition so as to increase the impedance of the transistor and render it less conducting.

Figure 2:
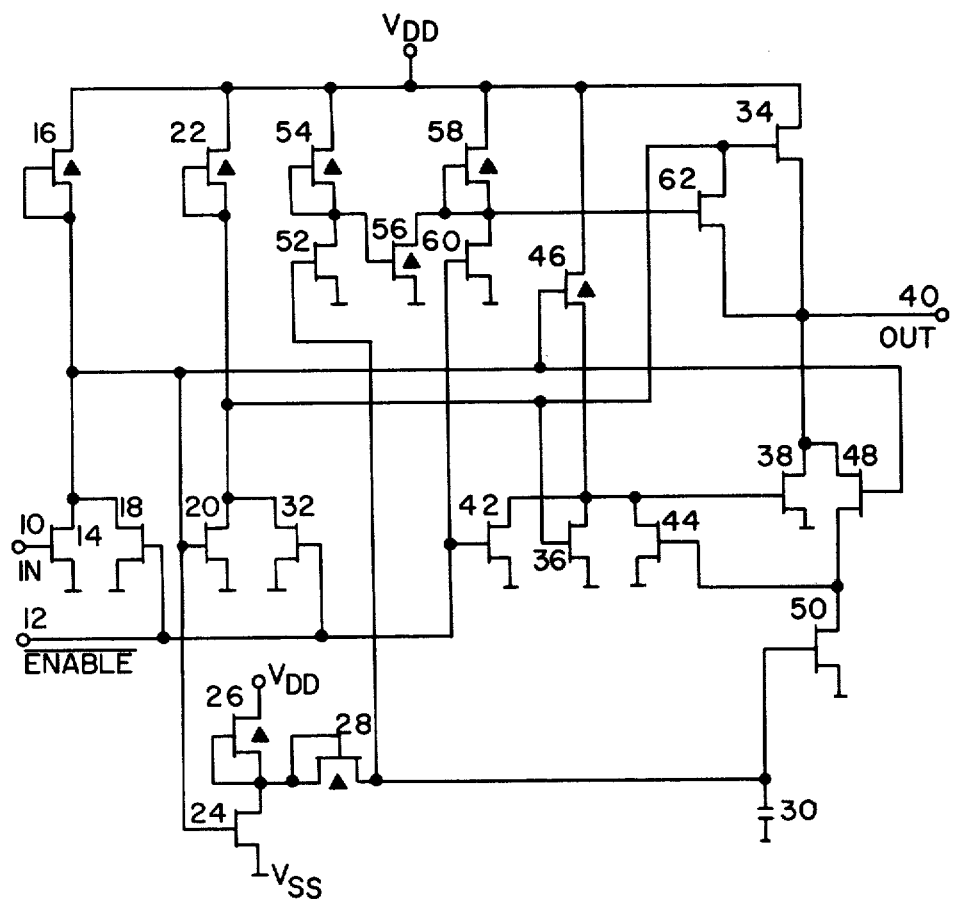
FIG. 2 is a schematic diagram of a non-inverting transistor bus driver incorporating overload protection circuitry according to the invention.

One type of bus driver non-inverting circuit equipped with short circuit protection is shown in FIG. 2. The bus driver, which employs field effect transistors, includes an input signal terminal 10 and an enable signal terminal 12. The input signal at terminal 10 is fed to the gate of a transistor 14 whose source is connected to a negative voltage supply $V_{SS}$, which may be ground, and whose drain is connected in series with a transistor 16 to a positive voltage supply $V_{DD}$. All circuit connections to the negative voltage supply $V_{SS}$ are shown as terminating in a short horizontal bar. The source and drain circuit of the transistor 14 is also connected in parallel with the source and drain circuit of a transistor 18 whose gate is coupled to the enable signal terminal 12.

The drain of transistor 14 is coupled to the gate of a transistor 20, whose source and drain circuit are connected in series with a transistor 22 to the voltage supply $V_{DD}$. The drain of transistor 14 is also connected to the gate of a transistor 24, whose source and drain circuit are connected in series with a transistor 26 to the voltage supply $V_{DD}$. The drain of the transistor 24 and the source of the transistor 26 are serially connected with a transistor 28 and a capacitor 30.

The source and drain circuit of transistor 20 is connected in parallel with the source and drain circuit of a transistor 32, whose gate is coupled to the enable signal terminal 12. The drain of transistor 20 is connected to the gate and source of transistor 22 and to the gate of a first output transistor 34, and thus the transistor 20 serves as the driver for the first output transistor 34. The drain of the transistor 20 is also connected to the gate of a transistor 36 and the drain of the transistor 36 is connected in series with a transistor 46 to the positive voltage supply $V_{DD}$. By having its drain coupled to the gate of a second output transistor 38, the transistor 36 serves as the drive transistor for the second output transistor 38. Hereinafter, the transistor 20 will be referred to as the first drive transistor and the transistor 36 will be referred to as the second drive transistor.

As will be seen, the output transistors 34 and 38 and the drive trasistors 20 and 36 form a push-pull output circuit at a common output terminal or bus 40.

The source and drain circuit of the transistor 36 is connected in parallel with the source and drain circuit of a transistor 42, the gate of which is coupled to the enable signal terminal 12, and is also connected in parallel with the source and drain circuit of a transistor 44. Thus, the drain and source of transistor 44, as well as the drain and source of the transistor 36, are connected across the gate and source of the second output transistor 38. Each of the source and drain circuits of the transistors 42, 36, and 44 is connected in series with the second drive transistor 46 to the voltage supply $V_{DD}$.

Two series connected transistors 48 and 50 are connected in parallel with the source and drain circuit of the second output transistor 38, and the junction of the transistors 48 and 50 is connected to the gate of the transistor 44. The gate of the transistor 50 is connected to the capacitor 30 and to the gate of a transistor 52. The source and drain circuit of the latter transistor 52 is connected in series with a transistor 54 to the voltage supply $V_{DD}$.

The junction of transistors 52 and 54 is connected to the gate of one transistor 56 that forms a voltage divider with another transistor 58 serially connected therewith across the voltage supply $V_{DD}$. The transistors 56 and 58 may be depletion mode, as shown, or enhancement mode devices. The lower potential transistor 56 is connected in parallel with a transistor 60 whose gate is coupled to the enable signal terminal 12. The junction of the voltage divider transistors 56 and 58 is connected to the gate of a transistor 62 whose drain and source are connected across the gate and source respectively of the first output transistor 34.

The transistors which have the same designation as transistor 16, for example, are depletion mode transistors that act like dynamic resistors. The depletion mode transistor never turns completely off so long as a positive voltage in excess of a given threshold voltage is applied to its gate, and its resistance changes inversely as the gate drive increases. The remaining transistors, such as those designated like transistor 14, are enhancement mode transistors that are normally off in the absence of positive gate voltage in excess of a given threshold or bias voltage.

All of the depletion mode transistors except transistor 28 serve as current limiting resistors for the enhancement mode transistors in series therewith. Transistor 28 provides a series resistance with capacitor 30 in an RC timing circuit, whose function will be explained more fully.

The normal operation of the driver circuit will now be described. The driver circuit is enabled when the signal at the enable signal terminal 12 is logic LOW, and is disabled when the signal is logic HIGH. For example, when the logic signal at the enable terminal 12 is HIGH, the shunt transistors 18, 32, 42 and 60 will conduct and thereby shunt to ground the input signal applied to the input signal terminal 10. To enable the driver circuit the enable signal must be LOW, so as to turn transistors 18, 32, 42 and 60 OFF. With the enable signal LOW, an input signal which is logic HIGH will turn transistor 14 ON, thereby turning the first drive transistor 20 OFF. When the first drive transistor 20 goes OFF, the transistor 22 pulls high to turn the first output transistor 34 ON, pulling the output terminal 40 to logic HIGH, and the second drive transistor 36 also goes ON turning the second output transistor 38 OFF and thereby pushing the output terminal 40 to logic HIGH. Thus a HIGH input signal is translated through the driver circuit to the output terminal 40 where it appears as a HIGH output signal with no inversion.

Conversely, a LOW input signal at the input terminal 10 will turn transistor 14 OFF, causing the first drive transistor 20 to turn ON. The first output transistor 34 turns OFF, the second drive transistor 36 turns OFF, and the transistor 46 pulls high to turn the second output transistor 38 ON. With the first output transistor 34 OFF and the second output transistor 38 ON, the voltage at the output terminal will be LOW. Thus, the LOW input signal has been translated through the driver circuit to the output terminal 40 as a LOW output signal with no inversion.

The short circuit protection circuitry is designed to operate either when the output terminal 40 is accidentally short circuited to LOW at a time when the first output transistor 34 is normally turned ON and conducting and when the output terminal 40 is normally HIGH, or when the output terminal 40 is accidentally short circuited to the voltage supply $V_{DD}$. Either type of short circuit may occur, for example, if the output terminal or bus 40, while being driven by the output transistors 34 and 38 to a logic HIGH or logic LOW is simultaneously driven by another driver to logic LOW or logic HIGH respectively.

The operation of the protection circuit will now be described for the case where the output terminal 40 is normally at logic LOW and is accidentally short circuited to logic HIGH. Before the short circuit occurs, if the signal output is LOW, the input signal is also LOW, transistor 14 is OFF and transistor 16 will have been pulled to logic HIGH, thereupon turning transistor 24 ON. With transistor 24 ON, the capacitor 30 will have discharged to a low voltage or ground, so that transistor 52 and transistor 50 are both OFF. With transistor 50 OFF and transistor 34 being OFF, transistor 48 will have no current path to the voltage supply $V_{DD}$ or to ground.

Now if the output terminal 40 suddenly goes HIGH, the excess current will flow not only through the second output transistor 38, but it will also flow through transistor 48, thus forcing transistor 44 to turn ON. When the transistor 44 turns ON, it reduces the gate driving voltage on the second output transistor 38, thereby increasing the impedance of the second output transistor and reducing the short circuit current to a safe value.

When the short ciruit is removed, the transistors 48, 44 and 38 return to their normal condition and the ouput terminal 40 returns to its normal LOW state. Therefore, the logic information that was present prior to the temporary short circuit is preserved.

Now the case will be described where the output terminal 40 is HIGH, the first output transistor 34 is conducting, or ON, and the second output transistor 38 is non-conducting, or OFF, and a short circuit to logic LOW occurs. Before the short circuit occurs, the input signal at the input terminal 10 will be HIGH and transistor 14 will be ON. Transistor 24 will be OFF, transistor 26 will be HIGH and transistor 52 will be ON. With transistor 52 ON, transistor 56 will be in higher impedance state than it was when transistor 52 was OFF, because the gate drive on transistor 56 will be less than it was, and the potential on the gate of transistor 62 will be at a higher lever. The ratio of the impedances of the two transistors 56 and 58 will preset the gate voltage level of transistor 62. The gate level of transistor 62 should be above the threshold voltage but less than the voltage level of the output terminal 40 when it is in the HIGH state. When the gate level is set at one threshold level above the desired protection level, for example, the transistor 62 will turn ON when the output terminal 40 is suddenly shorted to logic LOW. The ON transistor 62 shunts the gate drive voltage of the first output transistor 34, increasing the impedance of the latter and holding the short circit current to a safe value.

When the short circuit is removed, the transistors 62 and 34 return to their normal condition and the output terminal 40 returns to its normal HIGH state with no loss of logic information occurring.

When the bus driver is disabled, transistors 18, 32, 42, and 60 turn ON, disabling transistors 14, 20, 36, 44, 56, and turning OFF transistors 24, 62, 34, and 38. With the two output transitors 34 and 38 OFF, the output terminal 40 will be in a high impedance third state and the driver circuit will be effectively disconnected or rendered inoperative.

The circuit including capacitor 30 and transistor 28 is an RC time delay circuit which prevents the protection circuit from operating during the transition time between input logic level changes. The time delay circuit delays the transitions of the protection circuit transistors until after the transitions of the driver transistors have occurred. Typically, the resistance and capacitance values of the time delay circuit may be selected to have a time constant of about 40 nanoseconds.

Figure 3:
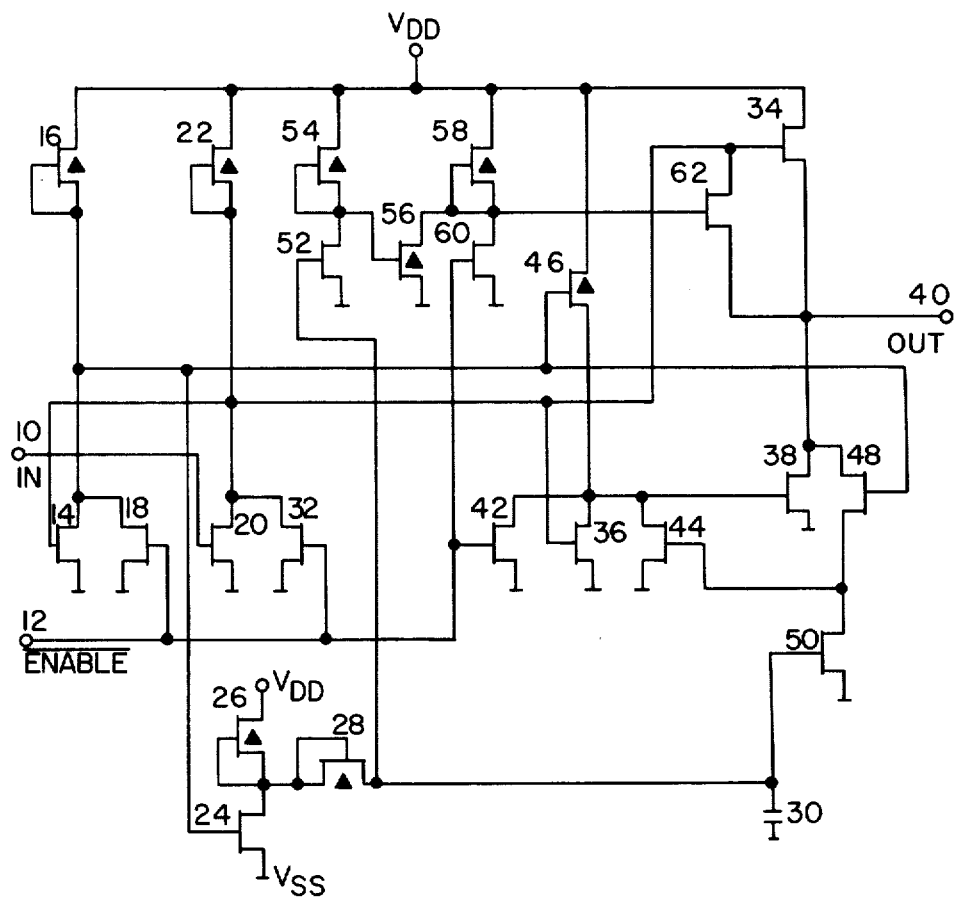
FIG. 3 is a schematic diagram of an inverting transistor bus driver incorporating overload protection circuitry according to the invention.

FIG. 3 shows a bus driver of the inverting type equipped with protection circuitry according to the invention. The same components of FIG. 2 are used but the circuit is slightly modified. The input signal is applied to the first drive transistor 20 instead of the transistor 14 so as to eliminate one inverter stage. In addition, the output of the first drive transistor 20 is used to drive the transistor 14 which in turn drives transistor 24 of the protection circuit. Since the signal at the output of the first drive transistor 20 has undergone one less inversion stage and the signal at the input of transistor 24 has undergone one additional inversion stage, the same relationship that existed between the two signals at those points in the non-inverting circuit of FIG. 2 is also maintained in the inverting circuit of FIG. 3. Except for the changes brought about by the above circuit modifications, the operation of the circuit of FIG. 3 is identical to that of FIG. 2 and therefore requires no further explanation.

What is claimed is:

1. In a bus driver circuit of the kind having an input circuit for receiving an input logic signal, an output circuit including a push-pull field effect transistor pair for driving an output bus connected to a common junction of said transistor pair, each of said transistor pair having a gate, source, and drain, and means including at least one inverter stage coupled between said input circuit and said output circuit for translating said input logic signal from said input circuit to said output circuit and developing a three state logic output signal at said output bus, the improvement of means for limiting current flow through one of said transistors that is normally conducting when said output bus is short circuited from a normally HIGH logic level to a LOW logic level and for limiting current flow through the other one of said transistors that is normally conducting when said output bus is short circuited from a normally LOW logic level to a HIGH logic level, said current limiting means comprising:

a first field effect transistor having a source to drain circuit connected in shunt between the gate and source of said one transistor, second and third field effect transistors connected in series with each other at a common junction and in parallel with the source to drain circuit of said other one transistor, and a fourth field effect transistor connected in shunt between the gate and source of said other one transistor, each of said first, second, third and fourth transistors having a gate, source, and drain, means coupling the gate of said fourth transistor to the common junction of said second and third transistors, said first transistor being normally non-conducting and rendered conducting to reduce the gate drive to said one transistor when said output bus is short circuited from a normally HIGH logic level to a LOW logic level, and said fourth transistor being normally non-conducting and rendered conducting to reduce the gate drive to said other one transistor when said output bus is short circuited from a normally LOW logic level to a HIGH logic level, said first and fourth transistors returning to their respective non-conducting states when the short circuits are removed, thereby to preserve the logic information present on said output bus before it was short circuited.

2. The invention according to claim 1, wherein said bus driver is a non-inverting type wherein the logic signal applied to the input appears at the output in non-inverting form.

3. The invention according to claim 1, wherein said bus driver is an inverting type wherein the logic signal applied to the input appears at the output in inverted form.

4. The invention according to claim 1, wherein said driver circuit is comprised of insulated gate field effect transistors.

5. The invention according to claim 1, and further including means for inhibiting operation of said current limiting means during normal transitions of the input signal between logic levels.

6. The invention according to claim 5, wherein said inhibiting means comprises an RC time delay circuit connected to the gate of said third transistor.

7. The invention according to claim 1, and further including fifth and sixth field effect transistors of insulated gate depletion mode type connected in series with each other at a common junction so as to form a voltage divider network, and means coupling said common junction of said fifth and sixth transistors to the gate of said first transistor to establish the protection voltage level at which said first transistor will operate.

8. The invention according to claim 7, wherein the ratio of the impedances of said fifth and sixth transistors are such as to preset the gate level of said first transistor to a value above the threshold voltage thereof and less than the voltage level of said output bus when it is in the HIGH logic level state.

9. A logic system comprising a plurality of bus drivers of the kind defined in claim 1 having their output circuits connected in common to said output bus and including enabling means for selectively enabling only one of said bus drivers to be operatively coupled to said output bus while the remainder of said bus drivers are effectively disconnected from said output bus.

10. The invention according to claim 1, and further including means connecting the gate of said second transistor to a signal terminal of said input circuit which is in phase with the signal on the gate of said other one transistor.

* * * * *